United States Patent
Lee

(10) Patent No.: US 11,222,705 B2
(45) Date of Patent: Jan. 11, 2022

(54) MEMORY DEVICE AND OPERATING METHOD OF THE MEMORY DEVICE

(71) Applicant: SK hynix Inc., Icheon-si (KR)

(72) Inventor: Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/900,433

(22) Filed: Jun. 12, 2020

(65) Prior Publication Data

US 2021/0183458 A1 Jun. 17, 2021

(30) Foreign Application Priority Data

Dec. 16, 2019 (KR) .................... 10-2019-0168206

(51) Int. Cl.
| | |
|---|---|
| *G11C 16/04* | (2006.01) |
| *G11C 16/34* | (2006.01) |
| *G11C 16/10* | (2006.01) |
| *G11C 16/30* | (2006.01) |
| *G11C 16/08* | (2006.01) |
| *G11C 16/24* | (2006.01) |
| *G11C 16/26* | (2006.01) |

(52) U.S. Cl.
CPC .......... *G11C 16/3436* (2013.01); *G11C 16/08* (2013.01); *G11C 16/10* (2013.01); *G11C 16/24* (2013.01); *G11C 16/26* (2013.01); *G11C 16/30* (2013.01)

(58) Field of Classification Search
CPC ..... G11C 16/3436; G11C 16/08; G11C 16/10; G11C 16/24; G11C 16/26; G11C 16/30
See application file for complete search history.

(56) References Cited

U.S. PATENT DOCUMENTS

| | | | |
|---|---|---|---|
| 9,251,901 B2 * | 2/2016 | Koo ................... | G11C 16/10 |
| 9,570,127 B1 * | 2/2017 | Seo ................... | G11C 16/0483 |
| 10,902,928 B2 * | 1/2021 | Park ................... | G11C 16/107 |

FOREIGN PATENT DOCUMENTS

| | | |
|---|---|---|
| KR | 1020180077970 A | 7/2018 |
| KR | 1020180099018 A | 9/2018 |

\* cited by examiner

*Primary Examiner* — Pho M Luu
(74) *Attorney, Agent, or Firm* — William Park & Associates Ltd.

(57) ABSTRACT

A memory device and an operating method thereof are provided. The memory device includes: a plurality of memory strings connected between a bit and source lines, the plurality of memory strings connected to a first select line, a plurality of word lines, and a second select line, which are disposed between the bit line and the source line; a peripheral circuit for programming a selected memory cell included in a selected memory string among the memory strings; and control logic for controlling the peripheral circuit to program the selected memory cell. The control logic controls the peripheral circuit to apply a positive voltage to the bit and source lines, which are connected to an unselected memory string, before a program voltage is applied to a selected word line connected to the selected memory cell, and discharge the word lines and the first and second select lines at different times.

15 Claims, 15 Drawing Sheets

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2019-0168206, filed on Dec. 16, 2019, in the Korean Intellectual Property Office, the entire disclosure of which is incorporated herein by reference.

BACKGROUND

1. Technical Field

The present disclosure generally relates to a memory device and an operating method of the memory device, and more particularly, to a memory device having a three-dimensional structure.

2. Related Art

A memory device may store data or output stored data. For example, a memory device may be configured as a volatile memory device in which stored data disappears when the supply of power is interrupted, or be configured as a nonvolatile memory device in which stored data is retained even when the supply of power is interrupted. The memory device may include a memory cell array configured to store data, a peripheral circuit configured to perform various operations such as program, read, and erase operations, and a control logic configured to control the peripheral circuit.

The nonvolatile memory device may be implemented in a two-dimensional (2D) structure in which memory cells are arranged in parallel to a substrate or a three-dimensional (3D) structure in which memory cells are stacked in a vertical direction from a substrate.

SUMMARY

In accordance with an aspect of the present disclosure, there is provided a memory device including: a plurality of memory strings connected between a bit line and a source line, the plurality of memory strings to which a first select line, a plurality of word lines, and a second select line, which are disposed between the bit line and the source line, are connected; a peripheral circuit configured to program a selected memory cell included in a selected memory string among the plurality of memory strings; and control logic configured to control the peripheral circuit to program the selected memory cell, wherein the control logic controls the peripheral circuit to apply a positive voltage to the bit line and the source line, which are connected to an unselected memory string, before a program voltage is applied to a selected word line connected to the selected memory cell, and discharge the word lines and the first and second select lines at different times.

In accordance with another aspect of the present disclosure, there is provided a method for operating a memory device, the method including: applying a bit line voltage as a positive voltage to a bit line connected to an unselected memory string, and applying a source line voltage as a positive voltage to a source line; discharging unselected word lines and a selected word line, in a state in which the bit line voltage and the source line voltage are applied to the bit line and the source line; discharging a first select line adjacent to the bit line and a second select line adjacent to the source line, when the unselected word lines and the selected word line are discharged; and programming a memory cell connected to a selected memory string by applying a program voltage to the selected word line.

In accordance with still another aspect of the present disclosure, there is provided a method for operating a memory device, the method including: applying a bit line voltage as a positive voltage to a bit line connected to an unselected memory string and applying a source line voltage as a positive voltage to a source line to maintain a voltage of a channel of the unselected memory string, before a memory cell connected to a selected memory string is programmed; discharging word lines in a state in which a positive voltage is applied to first and second select lines, to prevent a decrease in the voltage of the channel of the unselected memory string; discharging the first and second select lines, when the word lines are discharged; and programming the memory cell connected to the selected memory string, in a state in which the positive voltage is applied to the bit line connected to the unselected memory string.

BRIEF DESCRIPTION OF THE DRAWINGS

Examples of embodiments will now be described hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
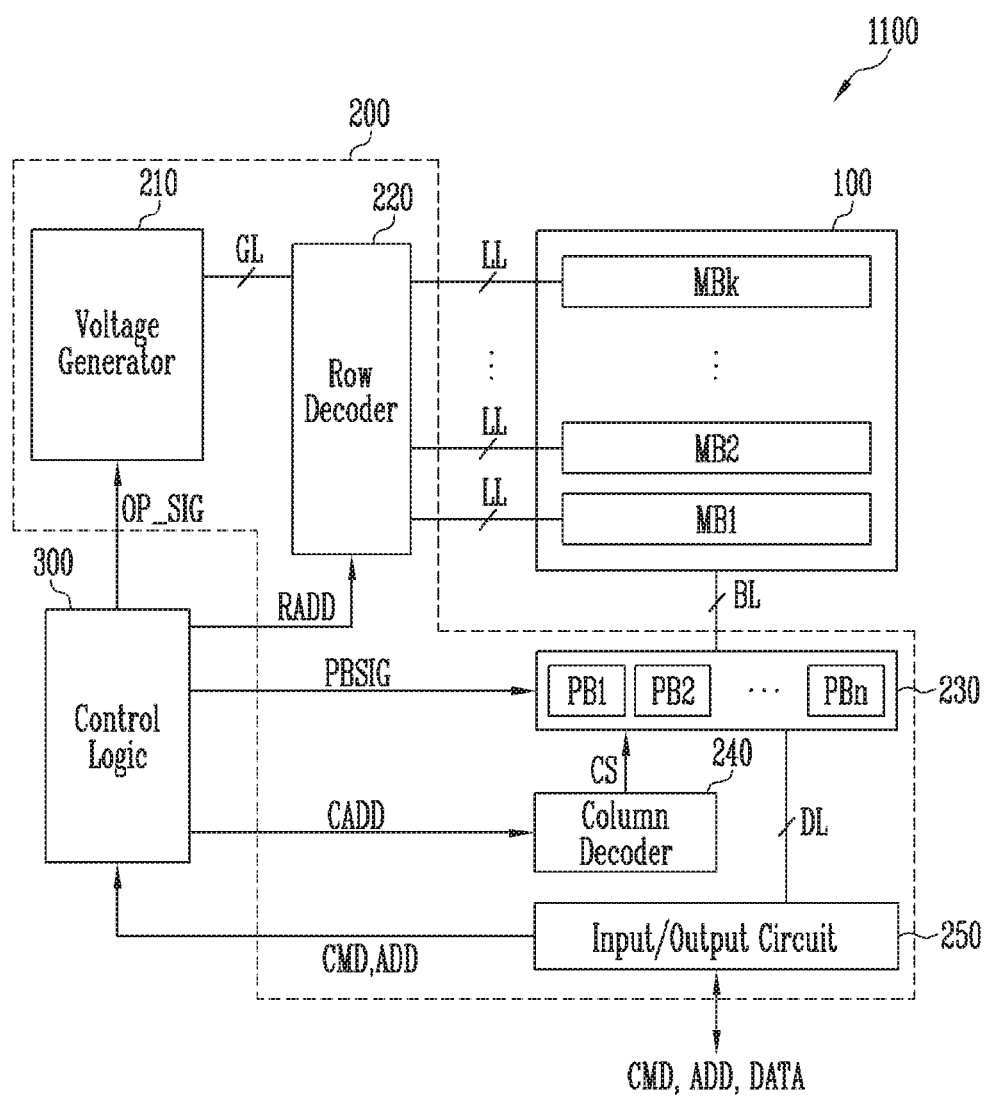
FIG. 1 is a diagram illustrating a memory system in accordance with an embodiment of the present disclosure.

FIG. 1 is a diagram illustrating a memory system in accordance with an embodiment of the present disclosure.

Referring to FIG. 1, the memory device 1100 may include a memory cell array 100 configured to store data, a peripheral circuit 200 configured to perform a program operation, a read operation, an erase operation, and the like, and control logic 300 configured to control the peripheral circuit 200. The control logic 300 may be implemented as hardware, software, or a combination of hardware and software. For example, the control logic 300 may be a control logic circuit operating in accordance with an algorithm and/or a processor executing control logic code.

The memory cell array 100 may include a plurality of memory blocks MB1 to MBk (k is a positive integer). The memory blocks MB1 to MBk may be configured in a three-dimensional structure. For example, the memory block having the three-dimensional structure may include memory cells stacked in a vertical direction from a substrate. The memory blocks MB1 to MBk may be configured in the same structure, and be connected to the peripheral circuit 200 through bit lines BL and local lines LL.

The peripheral circuit 200 may perform a program operation, a read operation, an erase operation, and the like in response to control signals OP_SIG and PBSIG and addresses PADD and CADD, which are output from the control logic 300. In order to perform these operations, the peripheral circuit 200 may include a voltage generator 210, a row decoder 220, a page buffer group 230, a column decoder 240, and an input/output circuit 250.

The voltage generator 210 may generate various operating voltages in response to an operating signal OP_SIG, and transmit the generated operating voltages to the row decoder 220 through global lines GL. For example, the voltage generator 210 may generate a verify voltage, a verify pass voltage, a drain voltage, a source voltage, a source line voltage, a bit line voltage, a program voltage, a program pass voltage, a bit line low voltage, a drain low voltage, and a source low voltage. Also, the voltage generator 210 may connect a selected line to a ground voltage, to decrease a voltage of the selected line down to 0V or a low voltage as a positive voltage close to V. Besides, the voltage generator 210 may generate various voltages used in the memory device 1100, such as an erase voltage and an erase pass voltage.

The row decoder 220 may select a memory block according to a row address RADD, and transmit operating voltages applied to the global lines GL to the selected memory block through the local lines LL.

The page buffer group 230 may be connected to the memory blocks MB1 to MBk through the bit lines BL, and include a plurality of page buffers PB1 to PBn respectively connected to the bit lines BL. The page buffer group 230 may control voltages of the bit lines BL or sense voltages or currents of the bit lines BL, in response to page control signals PBSIG.

The column decoder 240 may output column select signals CS such that the page buffer group 230 and the input/output circuit 250 can exchange data with each other, in response to a column address CADD. For example, when the input/output circuit 250 loads data to data lines DL, the column decoder 240 may control the page buffer group 230 such that the data loaded to the data lines DL are sequentially input to the page buffers PB1 to PBn, by sequentially outputting the column select signals CS. Also, the column decoder 240 may output the column select signals CS to sequentially transmit the data stored in the page buffers PB1 to PBk to the input/output circuit 250.

The input/output circuit 250 may receive a command CMD, an address ADD, and data DATA from the controller (1200 shown in FIG. 15), transmit the command CMD and the address ADD to the control logic 300, and transmit the data DATA to the page buffer group 230 through the data lines DL. Also, the input/output circuit 250 may output the data DATA received through the data lines DL to the controller 1200.

In addition, the peripheral circuit 200 may further include a current sensing circuit (not shown) configured to output a pass signal or a fail signal according to a number of fail bits in a verify operation.

The control logic 300 may control the peripheral circuit 200 in response to a command CMD and an address ADD. For example, the control logic 300 may output the operating signals OP_SIG and the page control signals PBSIG in response to the command CMD, and output the row address RADD and the column address CADD in response to the address ADD.

Figure 2:
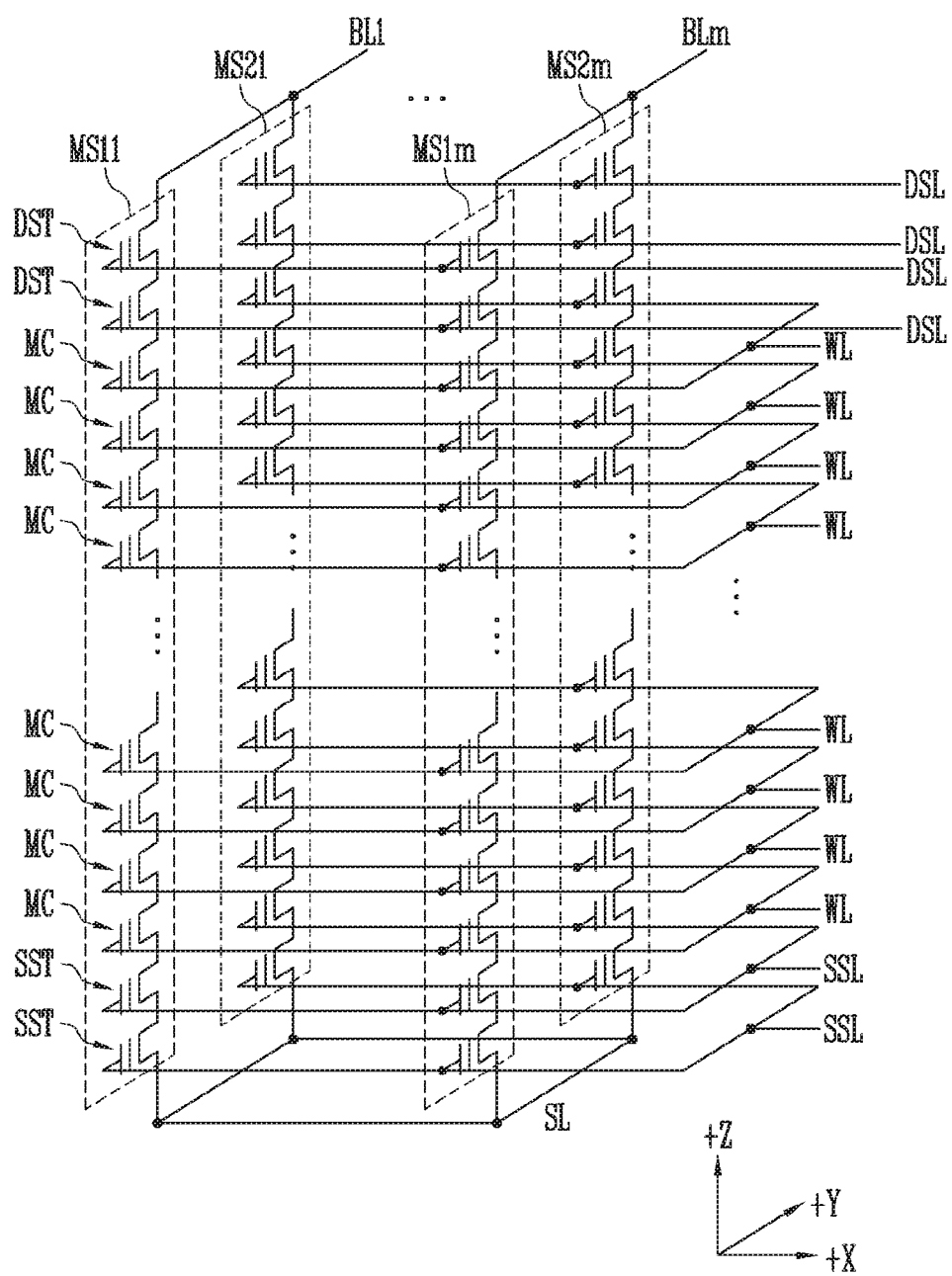
FIG. 2 is a circuit diagram illustrating an embodiment of a memory block shown in FIG. 1.

FIG. 2 is a circuit diagram illustrating an embodiment of a memory block shown in FIG. 1.

Referring to FIG. 2, the memory block MBk may include a plurality of memory strings MS11 to MS1$m$ and MS21 to MS2$m$ connected between bit lines BL1 to BLm and a source line SL. Each of the memory strings MS11 to MS1$m$ and MS21 to MS2$m$ may extend along a +Z direction. The +Z direction may be a direction in which memory cells MC are stacked, and be a direction vertical to a substrate. Here, m is an integer of 2 or more.

Each of the memory strings MS11 to MS1$m$ and MS21 to MS2$m$ may include at least one source select transistor SST, a plurality of memory cells MC, and at least one drain select transistor DST, which are connected in series.

Source select transistors SST included in one memory string (any one of MS11 to MS1$m$ and MS21 to MS2$m$) may be connected in series between the memory cells MC and the source line SL. Gate electrodes of the source select transistors SST are connected to source select lines SSL. In addition, source select transistors SST located at the same level may be connected to the same source select line SSL.

Memory cells MC included in one memory string (any one of MS11 to MS1$m$ and MS21 to MS2$m$) may be connected in series between at least one source select transistor SST and at least one drain select transistor DST. Gate electrodes of the memory cells MC are connected to word lines WL. Operating voltages (a program voltage, a pass voltage, a read voltage, and the like) necessary for driving may be applied to each of the word lines WL. In addition, memory cells located at the same level may be connected to the same word line WL.

Drain select transistors DST included in one memory string (any one of MS11 to MS1$m$ and MS21 to MS2$m$) may be connected in series between the bit lines BL1 to BLm and the memory cells MC. Gate electrodes of the drain select transistors DST are connected to drain select lines DSL. Drain select transistors DST located at the same level among drain select transistors DST of the memory strings MS11 to MS1$m$ and MS21 to MS2$m$, which are arranged on the same row (+X direction), may be connected to the same drain select line DSL. In addition, drain select transistors DST arranged on different rows (+X direction) may be connected to different drain select lines DSL.

Figure 3:
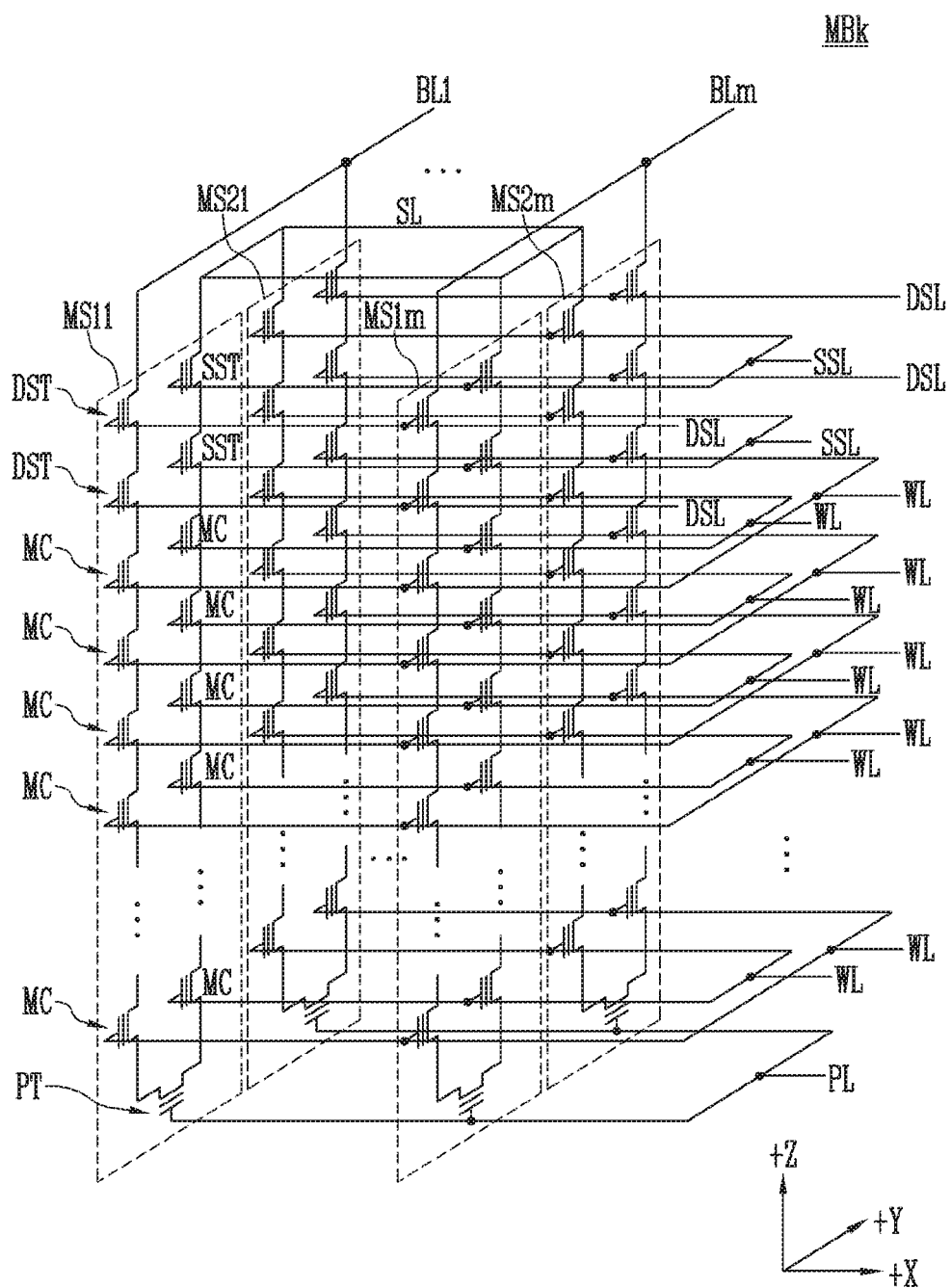
FIG. 3 is a circuit diagram illustrating another embodiment of the memory block shown in FIG. 1.

FIG. 3 is a circuit diagram illustrating another embodiment of the memory block shown in FIG. 1.

Referring to FIG. 3, the memory block MBk may include a plurality of memory strings MS11 to MS1$m$ and MS21 to MS2$m$. Each of the memory strings MS11 to MS1$m$ and MS21 to MS2$m$ may include at least one source select transistor SST, a plurality of memory cells MC, at least one pipe transistor PT, a plurality of memory cells MC, and at least one drain select transistor DST, which are connected in series. Each of the memory strings MS11 to MS1$m$ and MS21 to MS2$m$ may be arranged in a 'U' shape.

The pipe transistor PT may connect drain-side memory cells MC and source-side memory cells MC. In addition, a gate of the pipe transistor PT of each of the memory strings MS11 to MS1$m$ and MS21 to MS2$m$ may be connected to a pipe line PL.

The other components of the memory strings MS11 to MS1$m$ and MS21 to MS2$m$ except the above-described components are similar to those described with reference to FIG. 2, and therefore, overlapping descriptions will be omitted.

Figure 4:
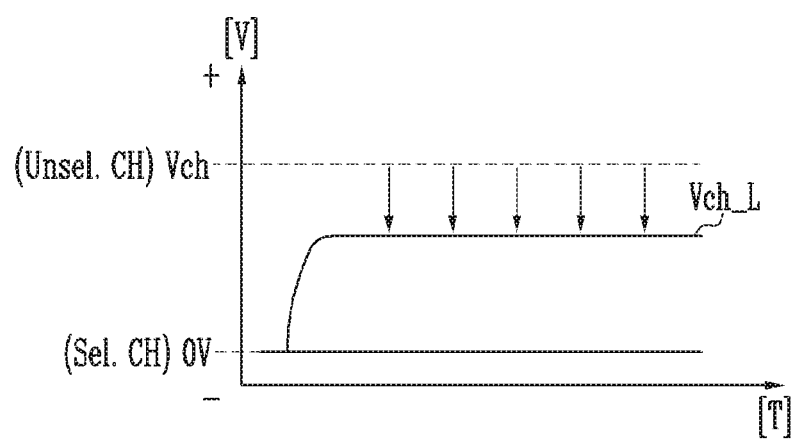
FIG. 4 is a diagram illustrating program disturbance which may occur in an unselected memory string.

FIG. 4 is a diagram illustrating program disturbance which may occur in an unselected memory string.

Referring to FIG. 4, memory cells included in an unselected memory string are to be program-inhibited. However, when a voltage of an unselected channel layer Unsel. CH is decreased to a channel low voltage Vch_L lower than a program-inhibited channel voltage Vch due to various reasons, disturbance may occur, in which the memory cells to be program-inhibited are programmed. The disturbance may occur because a difference between the voltage of the unselected channel layer Unsel. CH and a program voltage applied to a selected word line becomes small due to the decrease in the voltage of the unselected channel layer Unsel. CH to the channel low voltage Vch_L.

In this embodiment, in order to prevent a phenomenon in which the channel voltage Vch of the unselected memory string is decreased, voltages respectively applied to lines may be adjusted in a process of setting a program operation voltage.

Figure 5:
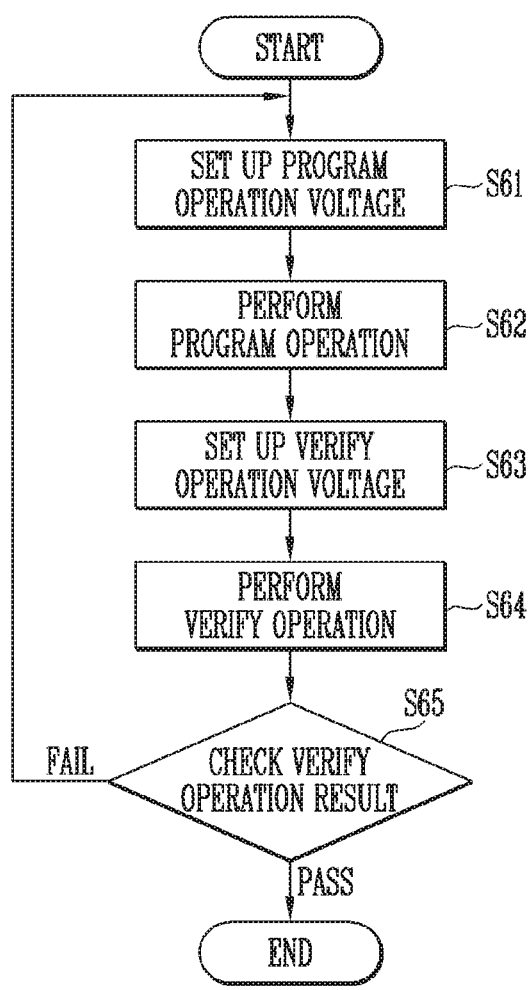
FIG. 5 is a flowchart illustrating a program operation in accordance with an embodiment of the present disclosure.

FIG. 5 is a flowchart illustrating a program operation in accordance with an embodiment of the present disclosure.

Referring to FIG. 5, the control logic (300 shown in FIG. 1) may control the peripheral circuit (200 shown in FIG. 1) to perform the following operation in response to a program command.

When a program operation is started, an operation S61 of setting up a program operation voltage may be performed. In the operation S61 of setting up the program operation voltage, the voltage generator (210 shown in FIG. 1) may generate voltages to be used in the program operation, preparation for performing a program operation S62 may be made by applying voltages to some lines connected to a selected memory string and an unselected memory string before the program operation S62 is performed. The page buffer group (230 shown in FIG. 1) may precharge all bit lines. For example, a positive voltage may be applied to a bit line and a source line, and unselected word lines Unsel. WL and a selected word line Sel may be discharged. Word lines WL may be discharged. An unselected drain select line and an unselected source line may be discharged, and different voltages may be respectively applied to selected bit lines and unselected bit lines.

The program operation S62 using the set-up program operation voltage may be performed. The program operation may be performed by selectively applying a program allow voltage or a program inhibit voltage to the bit lines, applying a program voltage to the selected word line, and applying a program pass voltage to the unselected word lines. The program allow voltage may be 0V. Alternatively, the program allow voltage may be a voltage having a voltage difference from the program voltage, which is large enough to allow electrons to be injected into a trap layer. The program inhibit voltage may be set as a positive voltage higher than 0V. For example, the program inhibit voltage may be a voltage having a voltage difference from the program voltage, which is small enough to allow electrons not to be injected into the trap layer. The program voltage may be set as a positive voltage at which electrons of a channel layer can be injected into the trap layer. The program pass voltage may be set to a level at which all memory cells connected to the unselected word lines can be turned on.

After the program voltage is applied to the selected word line for a certain time duration, an operation S63 of setting up a verify operation voltage may be performed. In the operation S63 of setting up the verify operation voltage, the voltage generator (210 shown in FIG. 1) may generate voltages to be used in a verify operation.

A verify operation S64 using the set-up verify operation voltage may be performed. The verify operation may be performed by precharging all the bit lines or selected bit lines, applying a verify voltage to the selected word line, and applying a verify pass voltage to the unselected word lines.

When the verify operation S64 is ended, an operation S65 of checking a verify operation result may be performed. For example, when threshold voltages of selected memory cells are all increased up to a target voltage, the verify operation result becomes PASS. When there exist memory cells of which the threshold voltages are not increased up to the target voltage, the verify operation result becomes FAIL. When the verify operation result indicates a failure FAIL, the operations S61 to S65 may be repeated until the verify operation result indicates that the threshold voltages of the selected memory cells are all increased up to the target voltage PASS.

Figure 6:
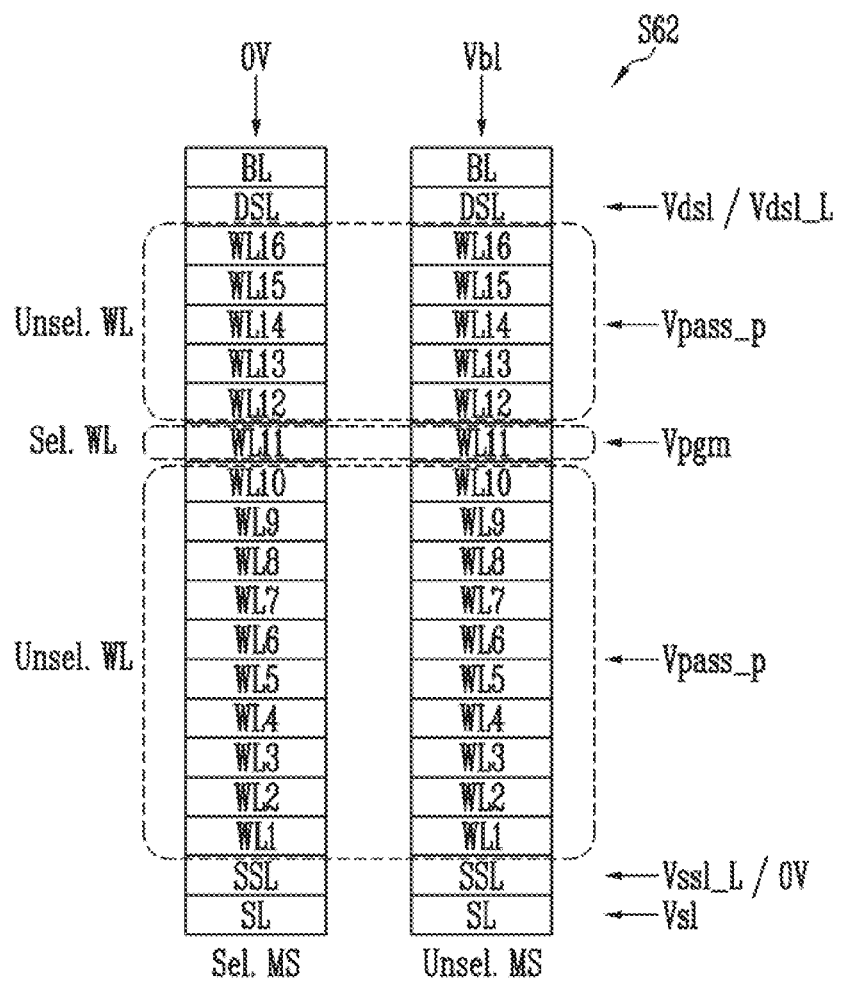
FIG. 6 is a diagram illustrating the program operation shown in FIG. 5.

FIG. 6 is a diagram illustrating the program operation shown in FIG. 5.

Referring to FIG. 6, in the program operation S62, memory strings may be divided into selected memory strings Sel. MS to which data is programmed and unselected memory strings Usel. MS to which the data is not programmed. A memory cell connected to a selected word line Sel. WL among memory cells included in the selected memory strings Sel. MS is to be programmed, and therefore, 0V may be applied bit lines BL of the selected memory strings Sel. MS. A memory cell connected to the selected word line Sel. WL among memory cells included in the unselected memory strings Unsel. MS is to be program-inhibited, and therefore, a bit line voltage Vbl as a positive voltage may be applied to bit lines BL of the unselected memory strings Unsel. MS.

A drain voltage Vdsl for turning on drain select transistors may be applied to selected drain select lines DSL connected to the selected memory strings Sel. MS, and 0V or a drain low voltage Vdsl_L for turning off or very weakly turning on the drain select transistors may be applied to unselected drain select lines DSL connected to the unselected memory strings Unsel. MS. The drain low voltage Vdsl_L may be a positive voltage lower than the drain voltage Vdsl at which the drain select transistors are completely turned on.

0V or a source low voltage Vssl_L for turning off or very weakly turning on source select transistors may be applied to selected source select lines SSL connected to the selected memory strings Sel. MS. The source low voltage Vssl_L may be a positive voltage lower than a source voltage Vssl at which the source select transistors are completely turned on.

A program pass voltage Vpass_p may be applied to the unselected word lines Unsel. WL, and a program voltage Vpgm may be applied to the selected word line Sel. WL. The program pass voltage Vpass_p may have a positive voltage level at which all memory cells connected to the unselected word lines Unsel. WL can be turned on.

When the program pass voltage Vpass_p and the program voltage Vpgm are applied to the unselected word lines Unsel. WL and the selected word line Sel. WL, channel boosting occurs in the unselected memory strings Unsel. MS, and therefore, the channel voltage of a channel layer may be increased.

In order to prevent the channel voltage of the unselected memory strings Unsel. MS from being decreased due to a reason such as leakage, a source line voltage Vsl having a positive voltage level may be applied to a source line SL.

Figure 7:
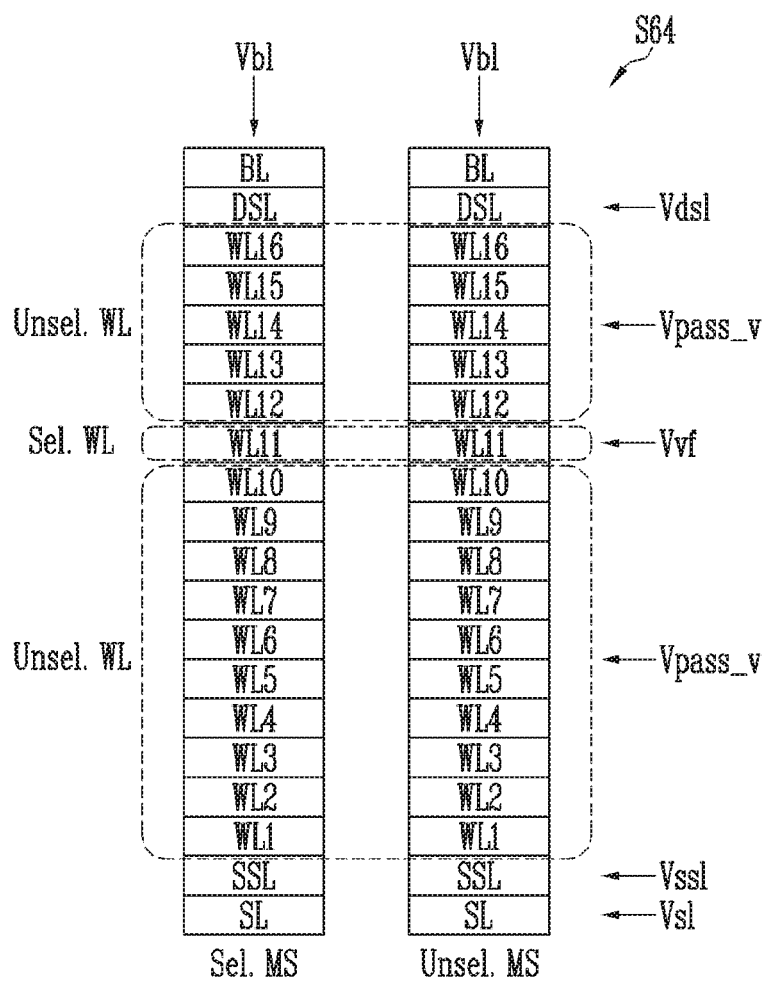
FIG. 7 is a diagram illustrating a verify operation shown in FIG. 5.

FIG. 7 is a diagram illustrating the verify operation shown in FIG. 5.

Referring to FIG. 7, in the verify operation S64, the bit line voltage Vbl having a positive voltage level may be applied to the bit lines BL connected to the selected memory strings Sel. MS and the unselected memory strings Unsel. MS, and the source line voltage Vsl having a positive voltage level may be applied to the source line SL.

The drain voltage Vdsl may be applied to the drain select lines DSL, and the source voltage Vssl may be applied to the source select lines SSL.

A verify pass voltage Vpass_v may be applied to the unselected word lines Unsel. WL, and a verify voltage Vvf may be applied to the selected word line Sel. WL. The verify pass voltage Vpass_v may have a positive voltage level at which all memory cells connected to the unselected word lines Unsel. WL can be turned on.

As described in FIGS. 6 and 7, electrical states of the selected memory strings Sel. MS and the unselected memory strings Unsel. MS in the program operation S62 and the verify operation S64 are different from each other. In particular, when a plurality of lines are simultaneously discharged before the program operation S62 is started, the potential of the channel layer of the unselected memory strings Unsel. MS may be lowered due to coupling. In this state, when the program operation S62 is performed, the channel voltage of the unselected memory strings Unsel. MS might not be sufficiently increased, and therefore, disturbance may occur in unselected memory cells.

Accordingly, in these embodiments, the voltages applied to some lines in the operation S61 of setting up the program operation voltage can be adjusted to prevent the occurrence of a disturbance.

Figure 8:
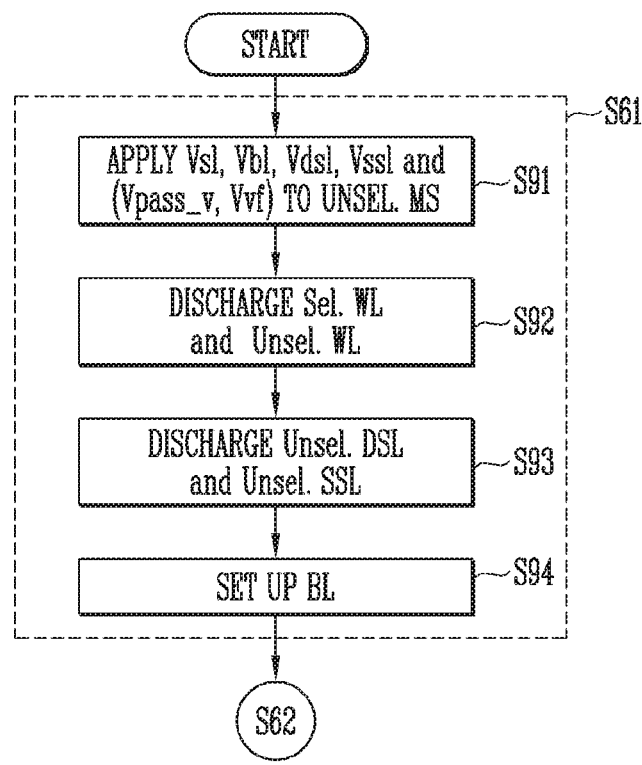
FIG. 8 is a diagram illustrating an operation of setting up a program operation voltage, which is shown in FIG. 5.

FIG. 8 is a diagram illustrating the operation of setting up the program operation voltage, which is shown in FIG. 5. FIG. 8 illustrates a method of applying voltages to the unselected memory strings Unsel. MS.

Referring to FIG. 8, the control logic (300 shown in FIG. 1) may control the peripheral circuit (200 shown in FIG. 1) to perform the operation of setting up the program operation voltage as follows.

Before the program operation S62 is performed, a step S91 of applying voltages having a positive voltage level to the unselected memory strings Unsel. MS may be performed to increase the channel voltage of the unselected memory strings Unsel. MS.

The source line voltage Vsl having a positive voltage level may be applied to the source line, and the bit line voltage Vbl having a positive voltage level may be applied to the bit lines. The source line voltage Vsl may be a positive voltage lower than the bit line voltage Vbl. The drain voltage Vdsl having a positive voltage level may be applied to the unselected drain select lines connected to the unselected memory strings, and the source voltage Vssl having a positive voltage level may be applied to unselected source select lines. The verify pass voltage Vpass_v may be applied to the unselected word lines, and the verify voltage Vvf may be applied to the selected word line.

Subsequently, a step S92 of discharging the selected word line Sel. WL and the unselected word lines Unsel. WL and a step S93 of discharging unselected drain select lines Unsel. DSL and unselected source select lines Unsel. SSL may be sequentially performed.

Subsequently, a step S94 of setting up potentials of the bit lines BL may be performed. For example, a program allow voltage or a program inhibit voltage may be applied to the bit lines BL according to data input to perform the program operation.

The steps S91 to S94 correspond to the operation of setting up the program operation voltage, which is performed while the program operation is being performed. In the operation of setting up the program operation voltage when the program operation is started for the first time, the operation of applying the verify pass voltage Vpass_v and the verify voltage Vvf in the step S91 may be omitted, and accordingly, the step S92 may also be omitted.

FIGS. 9 to 14 are diagrams illustrating embodiments for describing voltages applied to lines in the verify operation, the operation of setting up the program operation voltage, and the program operation.

Figure 9:
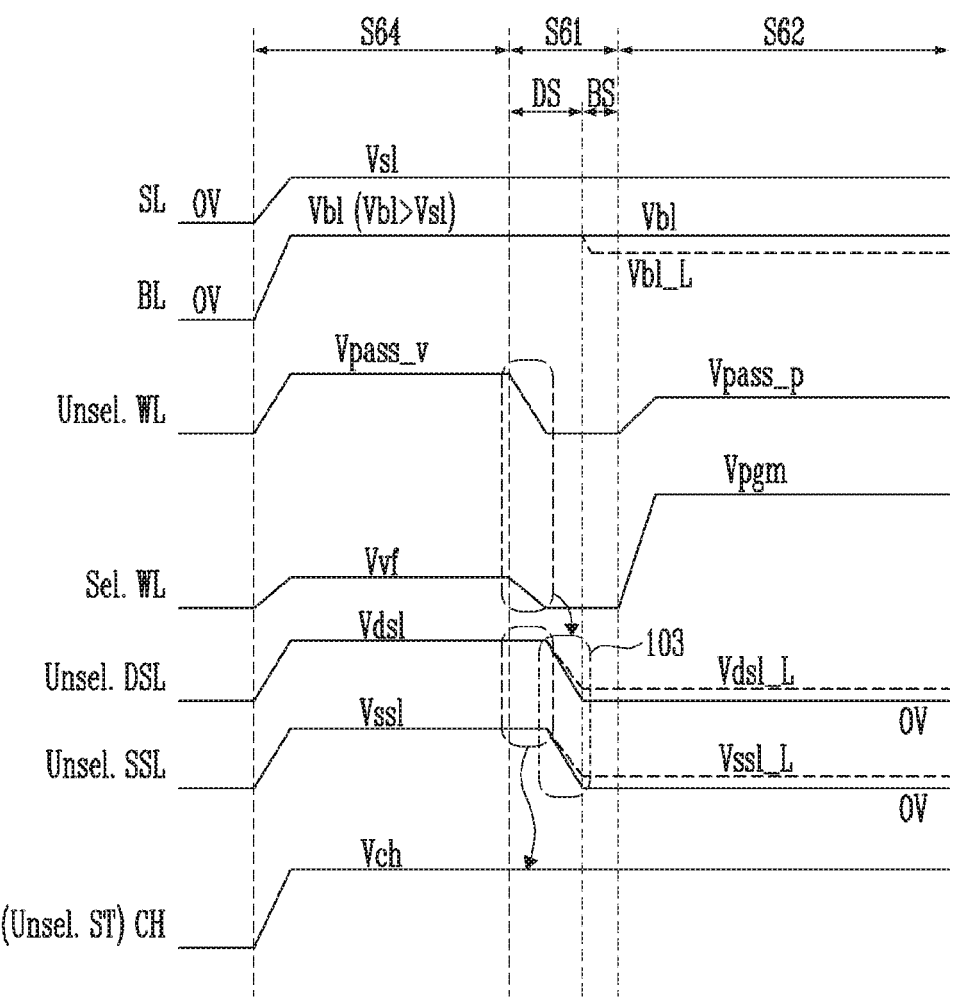
FIGS. 9 to 14 are diagrams illustrating embodiments for describing voltages applied to lines in the verify operation, the operation of setting up the program operation voltage, and the program operation.

Referring to FIG. 9, in the verify operation S64, the source line voltage Vsl having a positive voltage level may be applied to the source line, and the bit line voltage Vbl having a positive voltage level may be applied to the bit lines BL. A voltage difference between the source line voltage Vsl and the bit line voltage Vbl is to exist to perform the verify operation, and therefore, the source line voltage Vsl and the bit line voltage Vbl are set to different levels. For example, the source line voltage Vsl may be set as a positive voltage lower than the bit line voltage Vbl.

The verify pass voltage Vpass_v may be applied to the unselected word lines Unsel. WL, and the verify voltage Vvf may be applied to the selected word line Sel. WL. The verify pass voltage Vpass_v may be set as a positive voltage at which all memory cells connected to the unselected word lines Usel. WL can be turned on, and the verify voltage Vvf may be differently set depending on a target level of the program operation.

The drain voltage Vdsl may be applied to the unselected drain select lines Unsel. DSL, and the source voltage Vssl may be applied to the unselected source select lines Unsel. SSL. The drain voltage Vdsl and the source voltage Vssl may be set as a positive voltage at which unselected drain select transistors and unselected source select transistors can be turned on.

The channel voltage Vch of the unselected memory strings Unsel. MS may be increased to a positive voltage level by the bit line voltage Vbl and the source line voltage Vsl, which are applied to the bit lines BL and the source line SL.

When the verify operation S64 is completed, the operation (S65 shown in FIG. 5) of checking the verify operation result may be performed. When the verify operation result indicates a failure FAIL, the operation S61 of setting up the program operation voltage may be performed.

The operation S61 of setting up the program operation voltage may include a discharge step DS and a bit line setup step BS. In order to apply new voltages to lines, the corresponding lines may be discharged in the discharge step DS.

In the discharge step DS, the unselected word lines Unsel. WL and the selected word line Sel. WL may be discharged in a state in which the voltages Vsl and Vbl applied to the source line SL and the bit lines BL are maintained (101). While the unselected word lines Unsel. WL and the selected word line Sel. WL are being discharged (101), the drain voltage Vdsl and the source voltage Vssl are continuously applied to the unselected drain select lines Unsel. DSL and the unselected source select lines Unsel. SSL (102). That is, when the word lines Unsel. WL and Sel. WL and the unselected select lines Unsel. DSL and Unsel. SSL are simultaneously discharged, the channel voltage Vch of the unselected memory strings Unsel. MS may be decreased due to coupling, and therefore, the unselected select lines Unsel. DSL and Unsel. SSL are not discharged simultaneously with the word lines Unsel. WL and Sel. WL to prevent the decrease in the channel voltage Vch.

When the word lines Unsel. WL and Sel. WL are all discharged, the unselected select lines Unsel. DSL and Unsel. SSL are discharged (103). The unselected select lines Unsel. DSL and Unsel. SSL may be discharged to 0V, or be lowered down to the drain low voltage Vdsl_L or the source low voltage Vssl_L, which is slightly higher than 0V.

When the word lines Unsel. WL and Sel. WL and the unselected select lines Unsel. DSL and Unsel. SSL are all discharged, the bit line setup step BS may be performed.

In the bit line setup step BS, a program allow voltage or a program inhibit voltage may be applied to the bit lines BL according to data input to perform the program operation. FIG. 9 illustrates voltages applied to the unselected memory strings Unsel. MS, and therefore, the bit line voltage Vbl having a positive voltage level corresponding to the program inhibit voltage or a bit line low voltage Vbl_L may be applied to the bit lines BL. The bit line low voltage Vbl_L may be set as a positive voltage lower than the bit line voltage Vbl. That is, in the program operation S62, the channel voltage Vch of the unselected memory strings Unsel. MS is increased due to channel boosting, and therefore, the bit line low voltage Vbl_L lower than the bit line voltage Vbl used in the verify operation S64 may be applied.

When the voltage of the bit lines BL is set up, the program operation S62 may be performed.

While the program operation S62 is being performed, the bit line voltage Vbl or the bit line low voltage Vbl_L is continuously applied to the bit lines BL connected to the unselected memory strings Unsel. MS, and the source line voltage Vsl is continuously applied to the source line SL. The program pass voltage Vpass_v is applied to the unselected word lines Unsel. WL, and the program voltage Vpgm is applied to the selected word line Sel. WL. The program pass voltage Vpass_v may be set as a positive voltage lower than the program voltage Vpgm.

The unselected drain select transistors and the unselected source select transistors may be turned off by applying a voltage of 0V to the unselected drain select lines Unsel. DSL and the unselected source select lines Unsel. SSL. When the unselected drain select transistors and the unselected source select transistors are turned off, the channel layer of the unselected memory strings Unsel. MS is floated, and therefore, the channel voltage Vch may be increased due to channel boosting. Alternatively, the drain and source select transistors may be weakly turned on by applying the drain low voltage Vdsl_L and the source low voltage Vssl_L, which have a positive voltage level, to the unselected drain select lines Unsel. DSL and the unselected source select lines Unsel. SSL. This is a method for adjusting the channel voltage Vch, which may be selectively performed.

Figure 10:
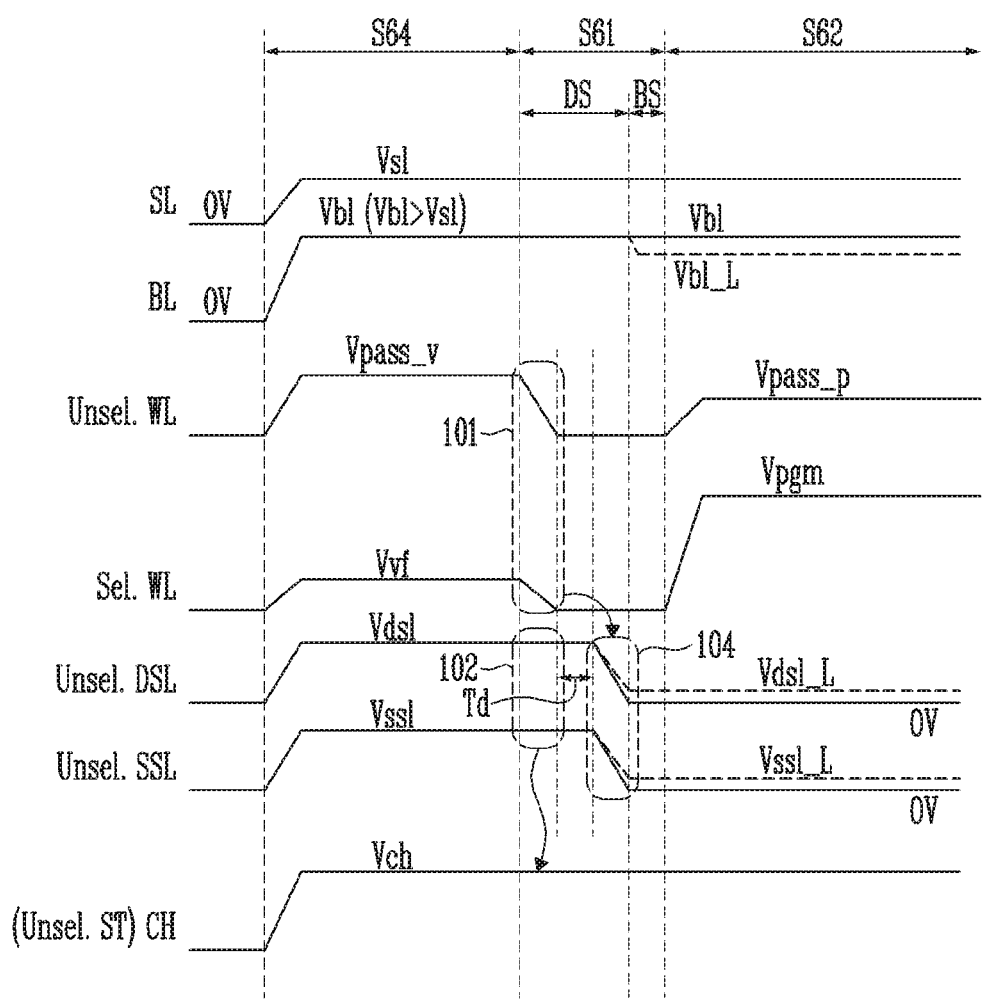

In the embodiments shown in FIG. 10, the discharge step DS may be performed using a method apart from the embodiments described in FIG. 9. The other steps except the discharge step DS may be performed identically to those described in FIG. 9.

Referring to FIG. 10, when all the word lines Unsel. WL and Sel. WL are discharged in the discharge step DS, the unselected select lines Unsel. DSL and Unsel. SSL may be discharged after a constant delay time Td (104). The unselected select lines Unsel. DSL and Unsel. SSL may be discharged to 0V, or be lowered down to the drain low voltage Vdsl_L or the source low voltage Vssl_L, which is slightly higher than 0V. When the unselected select lines Unsel. DSL and Unsel. SSL are all discharged, the bit line setup step BS may be performed.

Figure 11:
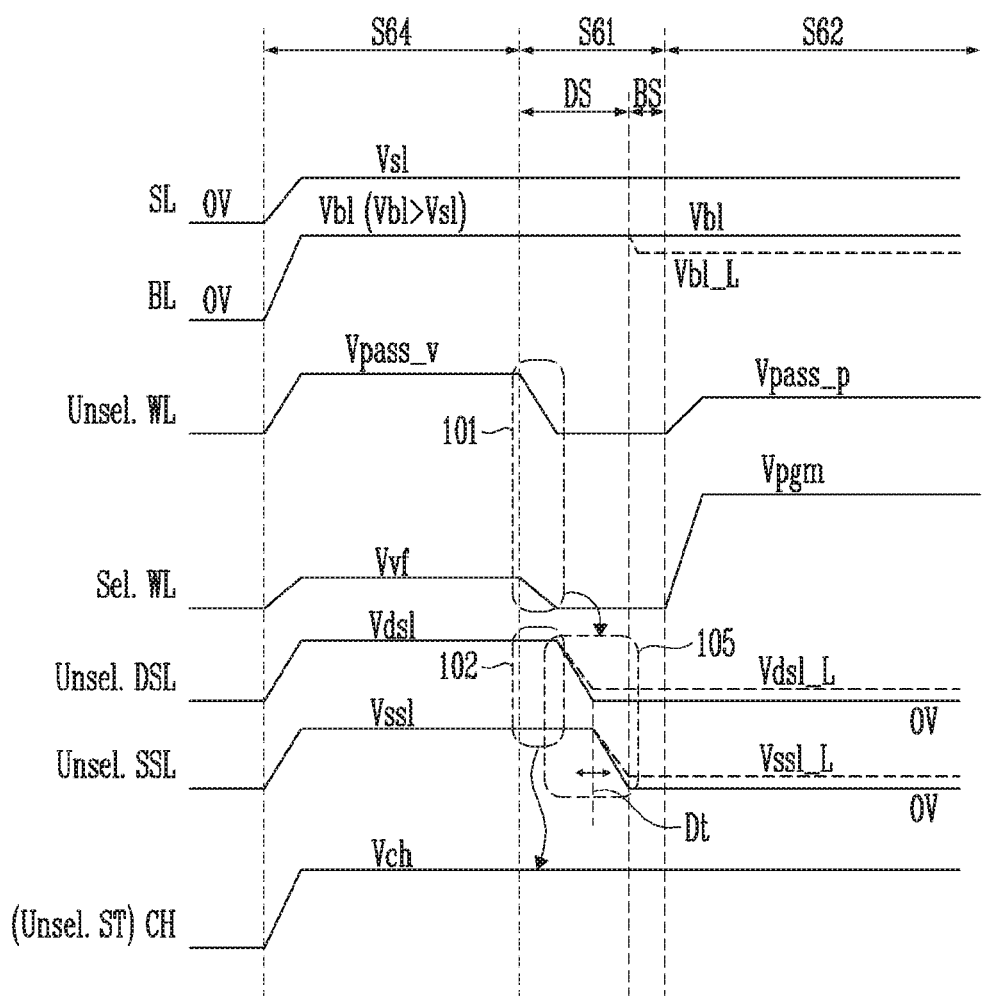

In the embodiments shown in FIG. 11, the discharge step DS may be performed using a method apart from the embodiments described in FIG. 10. The other steps except the discharge step DS may be performed identically to those described in FIG. 10.

Referring to FIG. 11, when all the word lines Unsel. WL and Sel. WL are discharged in the discharge step DS, the unselected drain select lines Unsel. DSL may be discharged earlier than the unselected source select lines Unsel. SSL. For example, the unselected drain select lines Unsel. DSL may be discharged when all the word lines Unsel. WL and Sel. WL are completely discharged. The unselected source select lines Unsel. SSL may be discharged after the unselected drain select lines Unsel. DSL start being discharged. A time Dt at which the unselected source select lines Unsel. SSL are discharged may be flexibly changed after the unselected drain select lines Unsel. DSL start to discharge. The unselected select lines Unsel. DSL and Unsel. SSL may be discharged to 0V, or be lowered down to the drain low voltage Vdsl_L or the source low voltage Vssl_L, which is slightly higher than 0V. When the unselected select lines Unsel. DSL and Unsel. SSL are all discharged, the bit line setup step BS may be performed.

Figure 12:
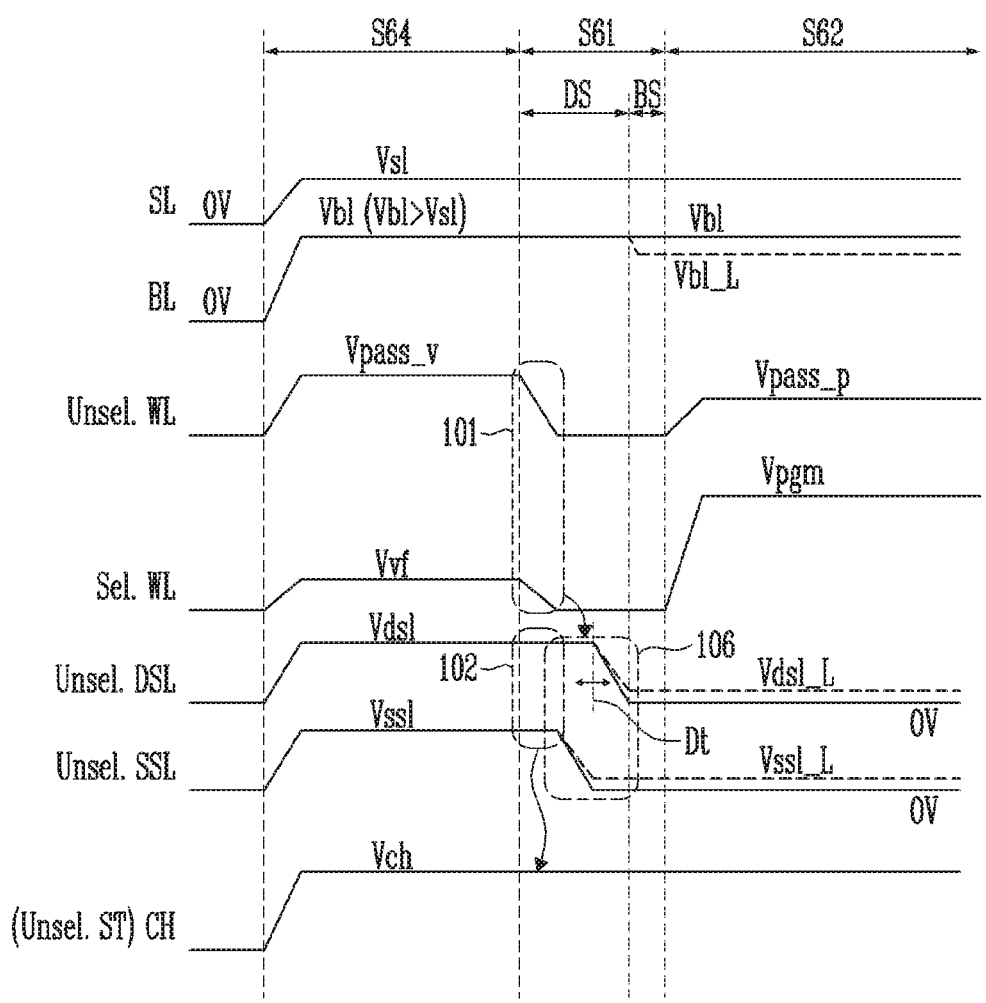

In the embodiments shown in FIG. 12, the discharge step DS may be performed using a method apart from the embodiments described in FIG. 11. The other steps except the discharge step DS may be performed identically to those described in FIG. 11.

Referring to FIG. 12, when all the word lines Unsel. WL and Sel. WL are discharged in the discharge step DS, the unselected source select lines Unsel. SSL may be discharged earlier than the unselected drain select lines Unsel. DSL. For example, the unselected source select lines Unsel. SSL may be discharged when all the word lines Unsel. WL and Sel. WL are completely discharged. The unselected drain select lines Unsel. DSL may be discharged after the unselected source select lines Unsel. SSL start being discharged. A time Dt at which the unselected drain select lines Unsel. DSL are discharged may be flexibly changed after the unselected source select lines Unsel. SSL start to discharge. The unselected source select lines Unsel. SSL may be discharged to 0V, or be lowered down to the drain low voltage Vdsl_L or the source low voltage Vssl_L, which is slightly higher than 0V. When the unselected select lines Unsel. DSL and Unsel. SSL are all discharged, the bit line setup step BS may be performed.

Figure 13:
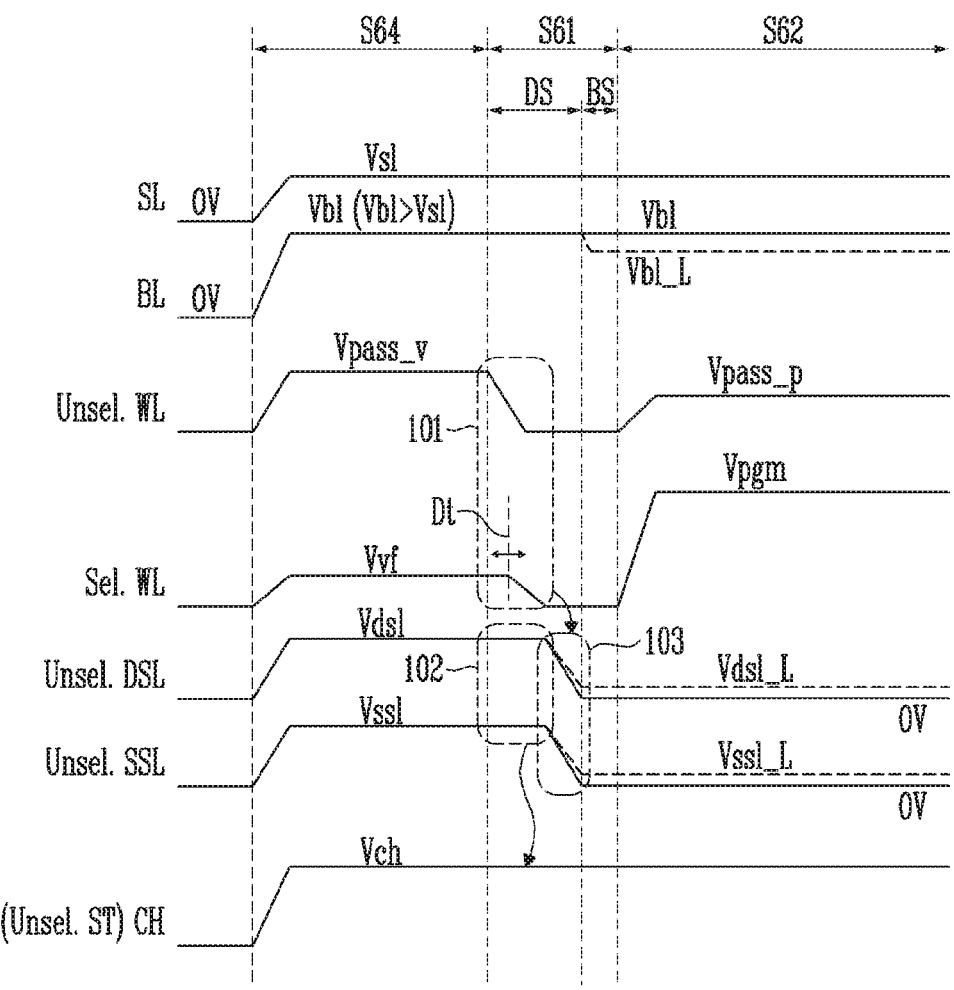

In the embodiments shown in FIG. 13, the discharge step DS may be performed using a method apart from the embodiments described in FIG. 9. The other steps except the discharge step DS may be performed identically to those described in FIG. 9.

Referring to FIG. 13, a discharge operation of the selected word line Sel. WL may be started after a discharge operation of the unselected word lines Usel. WL is started in the discharge step DS (101). A time Dt at which the selected word line Sel. WL is discharged may be flexibly changed after the unselected word lines Unsel. WL start to discharge. When all the word lines Sel. WL and Unsel. WL are discharged, a discharge operation of the unselected select lines Unsel. DSL and Unsel. SSL may be started (103).

Figure 14:
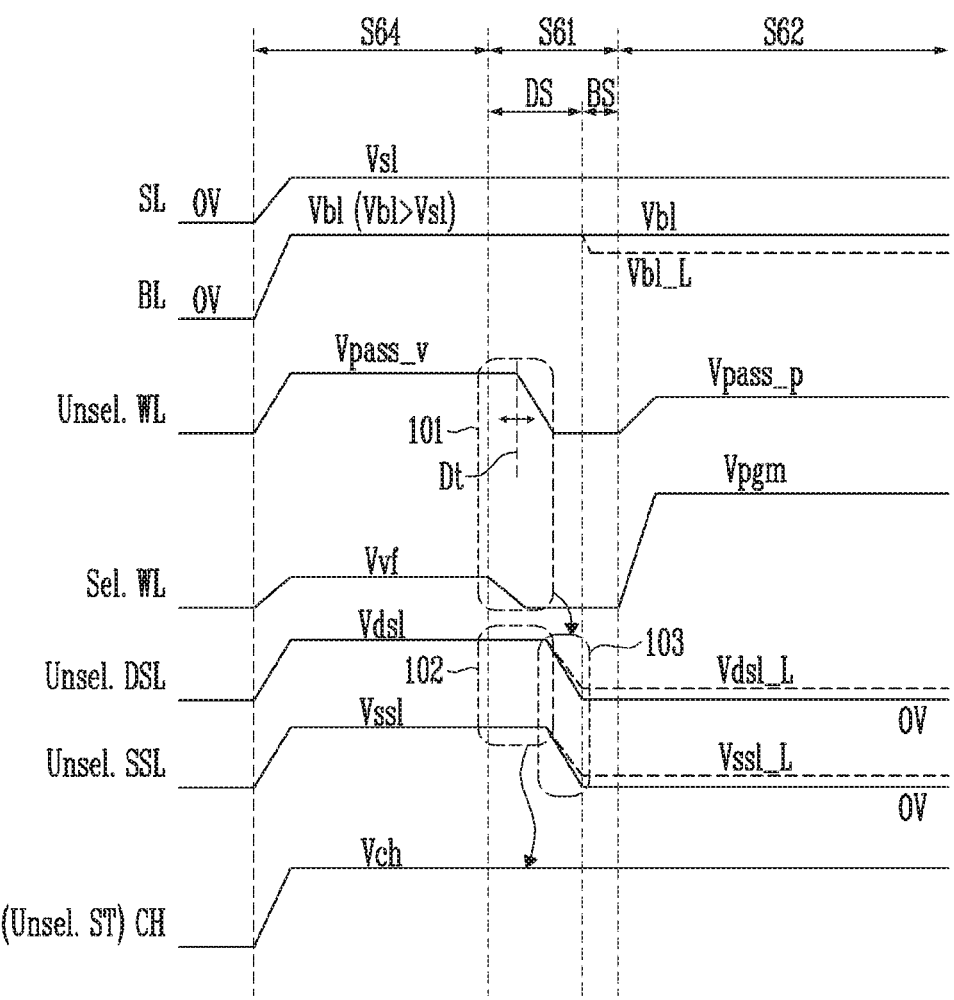

In the embodiments shown in FIG. 14, the discharge step DS may be performed using a method apart from the embodiments described in FIG. 9. The other steps except the discharge step DS may be performed identically to those described in FIG. 9.

Referring to FIG. 14, a discharge operation of the unselected word lines Unsel. WL may be started after a discharge operation of the selected word line Sel. WL is started in the discharge step DS (101). A time Dt at which the unselected word lines Unsel. WL are discharged may be flexibly changed after the selected word line Sel. MS starts to discharge. When all the word lines Sel. WL and Unsel. WL are discharged, a discharge operation of the unselected select lines Unsel. DSL and Unsel. SSL may be started (103).

In addition to the embodiments described in FIGS. 9 to 14, discharge times of the word lines Sel. WL and Unsel. WL and the unselected select lines Unsel. DSL and Unsel. SSL may be variously changed in the discharge step DS.

Figure 15:
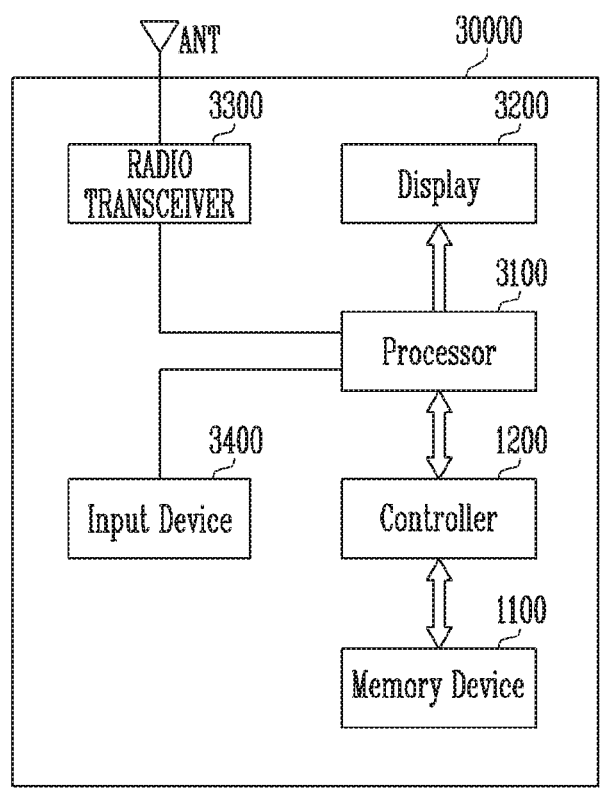
FIG. 15 is a diagram illustrating an embodiment of the memory system including the memory device shown in FIG. 1.

FIG. 15 is a diagram illustrating an embodiment of the memory system including the memory devices shown in FIG. 1.

Referring to FIG. 15, the memory system 30000 may be implemented as a cellular phone, a smart phone, a tablet PC, a personal digital assistant (PDA), or a wireless communication device. The memory system 30000 may include a memory device 1100 and a controller 1200 capable of controlling an operation of the memory device 1100. The controller 1200 may control a data access operation of the memory device 1100, e.g., a program operation, an erase operation, a read operation, or the like under the control of a processor 3100.

Data programmed in the memory device 1100 may be output through a display 3200 under the control of the controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 1200 or the display 3200. The controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the controller 1200, data output from the radio transceiver 3300, or data output from the input device 3400 can be output through the display 3200.

In some embodiments, the controller 1200 capable of controlling an operation of the memory device 1100 may be implemented as a part of the processor 3100, or may be implemented as a chip separate from the processor 3100.

Figure 16:
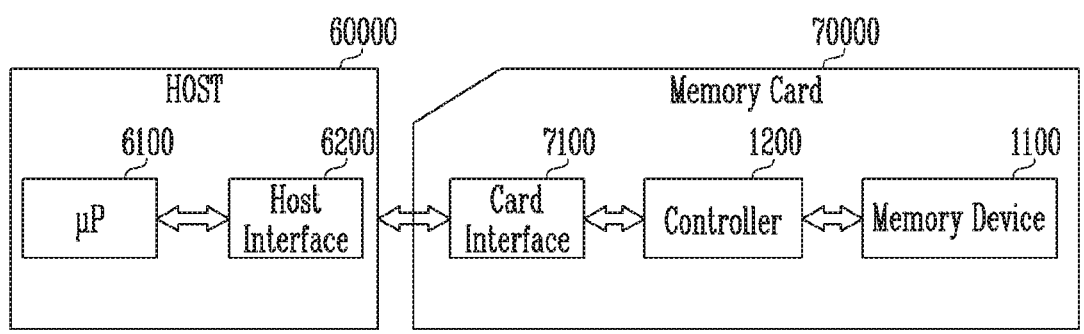
FIG. 16 is a diagram illustrating another embodiment of the memory system including the memory device shown in FIG. 1.

FIG. 16 is a diagram illustrating another embodiment of the memory system including the memory devices shown in FIG. 1.

Referring to FIG. 16, the memory system 70000 may be implemented as a memory card or a smart card. The memory system 70000 may include a memory device 1100, a controller 1200, and a card interface 7100.

The controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between the host 60000 and the controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 under the control of a microprocessor (μP) 6100.

In accordance with the present disclosure, program disturb which may occur in an unselected memory cell is suppressed, so that the reliability of the memory device can be improved.

What is claimed is:

1. A memory device comprising:
  a plurality of memory strings connected between a bit line and a source line, the plurality of memory strings to which a first select line, a plurality of word lines, and a second select line, which are disposed between the bit line and the source line, are connected;
  a peripheral circuit configured to program a selected memory cell included in a selected memory string among the plurality of memory strings; and
  control logic configured to control the peripheral circuit to program the selected memory cell,
  wherein the control logic controls the peripheral circuit to apply a positive voltage to the bit line and the source line, which are connected to an unselected memory string, before a program voltage is applied to a selected word line connected to the selected memory cell, and discharge the word lines and the first and second select lines at different times.

2. The memory device of claim 1, wherein the control logic control the peripheral circuit to:
  maintain the positive voltage applied to the bit line and the source line in a verify operation of the selected memory cell;
  discharge the word lines; and
  discharge the first and second select lines, when the word lines are discharged.

3. The memory device of claim 2, wherein the control logic controls the peripheral circuit to apply a bit line voltage, having a positive voltage, to the bit line connected to the unselected memory string, when the first and second select lines are discharged.

4. The memory device of claim 3, wherein the peripheral circuit applies a source line voltage as a positive voltage lower than the bit line voltage to the source line, when the bit line voltage is applied to the bit line.

5. The memory device of claim 1, wherein the peripheral circuit maintains the first and second select lines connected to the unselected memory string in a discharge state, when the program voltage is applied to the selected word line.

6. The memory device of claim 1, wherein the peripheral circuit applies a program pass voltage to unselected word lines except the selected word line, when the program voltage is applied to the selected word line.

7. The memory device of claim 6, wherein the program pass voltage has a positive voltage level at which memory cells connected to the unselected word lines are turned on.

8. The memory device of claim 1, wherein the peripheral circuit omits the discharging of the word lines and the first and second select lines, which are connected to the unselected memory string, when a program operation of the selected memory cell is started for the first time.

9. A method for operating a memory device, the method comprising:
   applying a bit line voltage as a positive voltage to a bit line connected to an unselected memory string, and applying a source line voltage as a positive voltage to a source line;
   discharging unselected word lines and a selected word line, in a state in which the bit line voltage and the source line voltage are applied to the bit line and the source line;
   discharging a first select line adjacent to the bit line and a second select line adjacent to the source line, when the unselected word lines and the selected word line are discharged; and
   programming a memory cell connected to a selected memory string by applying a program voltage to the selected word line.

10. The method of claim 9, wherein the source line voltage has a positive voltage level lower than the bit line voltage.

11. The method of claim 9, further comprising verifying the memory cell connected to the selected memory string, before the bit line voltage and the source line voltage are applied to the bit line and the source line.

12. The method of claim 11, wherein, in the verifying of the memory cell,
   a verify pass voltage is applied to the unselected word lines,
   a verify voltage is applied to the selected word line, and
   a voltage for turning on select transistors is applied to the first and second select lines.

13. The method of claim 9, wherein, before the programming of the memory cell, a program allow voltage is applied to a bit line connected to the selected memory string, and the bit line voltage applied to a bit line connected to the unselected memory string is maintained.

14. A method for operating a memory device, the method comprising:
   applying a bit line voltage as a positive voltage to a bit line connected to an unselected memory string and applying a source line voltage as a positive voltage to a source line to maintain a voltage of a channel of the unselected memory string, before a memory cell connected to a selected memory string is programmed;
   discharging word lines in a state in which a positive voltage is applied to first and second select lines, to prevent a decrease in the voltage of the channel of the unselected memory string;
   discharging the first and second select lines, when the word lines are discharged; and
   programming the memory cell connected to the selected memory string, in a state in which the positive voltage is applied to the bit line connected to the unselected memory string.

15. The method of claim 14, wherein the bit line voltage is continuously applied to the bit line, in the discharging of the word lines and the discharging of the first and second select lines.

* * * * *